US007418104B2

(12) United States Patent
Spinale

(10) Patent No.: US 7,418,104 B2
(45) Date of Patent: Aug. 26, 2008

(54) SPEAKER SYSTEM

(76) Inventor: Robert G. Spinale, 18 Dudley Dr., Middleton, NH (US) 03887

( * ) Notice: Subject to any disclaimer, the term of this patent is extended or adjusted under 35 U.S.C. 154(b) by 659 days.

(21) Appl. No.: 10/213,459

(22) Filed: Aug. 6, 2002

(65) Prior Publication Data

US 2004/0028240 A1 Feb. 12, 2004

(51) Int. Cl.
*H04R 1/02* (2006.01)
*H04R 25/00* (2006.01)
*H05K 5/00* (2006.01)
*A47B 81/06* (2006.01)
*H03G 5/00* (2006.01)

(52) U.S. Cl. ......................... 381/87; 381/345; 381/182; 381/186; 381/349; 381/386; 381/99; 181/144; 181/145; 181/147; 181/199

(58) Field of Classification Search .................. 381/87, 381/99, 345, 349, 182, 186, 386, 353, 354, 381/332-336, 303-305; 181/144, 145, 147, 181/199
See application file for complete search history.

(56) References Cited

U.S. PATENT DOCUMENTS

| | | | | |
|---|---|---|---|---|
| 3,982,607 | A * | 9/1976 | Evans | 181/152 |
| 4,224,469 | A * | 9/1980 | Karson | 381/353 |
| 4,226,092 | A * | 10/1980 | Luthi | 62/374 |
| 4,266,092 | A * | 5/1981 | Barker, III | 381/305 |
| 4,811,403 | A * | 3/1989 | Henricksen et al. | 381/87 |
| 5,502,772 | A * | 3/1996 | Felder | 381/386 |
| 5,937,072 | A * | 8/1999 | Combest | 381/99 |
| 6,625,289 | B1 * | 9/2003 | Oliemuller | 381/182 |

* cited by examiner

*Primary Examiner*—Vivian Chin
*Assistant Examiner*—Devona E. Faulk
(74) *Attorney, Agent, or Firm*—Michael J. Persson; Lawson & Persson, P.C.

(57) ABSTRACT

A speaker system having a first speaker, a second speaker, and a housing having a first mounting surface to which the first speaker is mounted and a second mounting surface to which the second speaker is mounted. The first mounting surface and the second mounting surface are substantially planar and abut one another to form an included angle of between 120 degrees and 140 degrees. By so arranging the mounting surfaces, the sound produced by each speaker is allowed to mix to provide a full sound.

18 Claims, 5 Drawing Sheets

SPEAKER SYSTEM

FIELD OF THE INVENTION

The present invention relates to the field of speaker systems and, in particular, to speaker systems having multiple speakers disposed within a single speaker housing.

BACKGROUND OF THE INVENTION

Audio speakers and speaker systems have been the subject of a great deal of research and design modification over the years in an effort to improve the quality of the sound produced by the speaker as perceived by the listener. The present invention builds upon many of these prior advances and results in a speaker system that produces a quality of sound that is much improved over prior designs.

Most audio loudspeakers are approximately cone shaped and vibrate in response to an electrical signal, thus producing sound waves. One way of improving the quality of sound is to improve the quality of the electrical signal received by the speaker. Another way is to improve the quality of the sound generated by the speaker itself. The latter improvement relates mostly to the materials and the design of the speaker.

Over a period of time speakers have become specialized. Speakers that produce high tones, or sound waves of high frequency, are designed differently and are of a different size than speakers that produce tones at a lower range. Accordingly, speakers are commonly divided into four categories: (1) tweeters, which produce the highest tones; (2) woofers, which produce the lowest tones, (3) mid-ranges, which produce tones bridging the gap between those produced by tweeters and woofers, and (4) full ranges, which produce the broadest range of tones. There is typically some overlap between the sound tones produced by speakers. Thus, a woofer may produce sound frequencies at the upper end of its frequency range that overlaps frequencies produced by a midrange speaker at the lower end of its frequency response range.

Modern speaker systems typically fall into two categories; integrated systems in which multiple speakers are mounted within a single housing, and component level systems in which multiple speakers, each having its own housing, are used to provide a full range of sound. Because multiple speakers are used in each system, the quality of the sound perceived by a listener depends not only on the quality of sound produced by each speaker, but also by the complex way each speaker interacts with every other speaker.

Component level systems offer the most flexibility in the configuration of speakers and, therefore, the most flexibility in the mixing of the sound produced thereby. By placing a variety of speakers in different orientations relative to one another, the listener can optimize the sound produced by the system. However, component level systems also have a number of drawbacks. First, the use of separate speakers requires that separate housings and cable connections be provided for each speaker, dramatically increasing the cost of the system. Second, the need for separate wires to supply sound to each speaker generates a large number of wires to conceal and can cause difficulty in attaching the wires to the connectors on the amplifier. Third, in order to properly aim the separate speakers, speaker stands or brackets with adjustable mounts must be purchased and disposed with the room. Finally, the use of a number of components takes up a relatively large amount of space compared to that taken up by integrated systems.

Because of the drawbacks inherent in component level systems, the use of integrated speaker systems would be preferred, provided that such a system were capable of adequately mixing the sound produced by each of the speakers mounted thereon. However, these systems have not, heretofore, had this ability. This is due to the fact that the housings surrounding the speakers in conventional speaker systems are typically designed to have a single, substantially planar, front surface into which the speaker, or speakers, is mounted. Because the speakers are mounted to a planar surface, the sound emanating from each speaker begins its travel in parallel relation to that produced by the other speakers and is not fully mixed until it has traveled a significant distance into the room and, or is allowed to bounce off of walls or other obstructions. Accordingly, these systems lack the fullness of sound that can be achieved using component level systems.

Therefore, there is a need for a speaker system that provides a full mixing of the sound generated by the various speakers making up the system, that does not require the separate housings and cable connections of component level systems, does not require the use of multiple wires to connect the system to an amplifier, takes up a minimum of space, and does not require the use of separate stands or brackets in order to aim the speakers for optimum performance.

SUMMARY OF THE INVENTION

The present invention is a speaker system that overcomes the above-mentioned drawbacks inherent in the prior art. In its most basic form, the speaker system of the present invention includes a first speaker, a second speaker, and a housing having a first mounting surface to which the first speaker is mounted and a second mounting surface to which the second speaker is mounted. The first mounting surface and the second mounting surface are substantially planar and abut one another to form an included angle of between 120 degrees and 140 degrees. By so arranging the mounting surfaces, the sound produced by each speaker is allowed to mix to provide a fullness of sound that could not be achieved using prior art systems.

In some embodiments of the system, the included angle is between 125 degrees and 135 degrees while in others the included angle is between 130 and 135 degrees. In the preferred embodiment, the included angle between the first mounting surface and the second mounting surface is 132 degrees.

The housing of the preferred speaker system has a top portion that includes the first mounting surface and a bottom portion that includes the second mounting surface. In this embodiment, the top portion of the housing is substantially sealed from the bottom portion of the housing to prevent the back wave created by the speaker mounted to the first mounting surface from interfering with the back wave created by the speaker mounted to the second mounting surface.

In some embodiments of the invention, the first speaker is a full range type speaker and the second speaker is a woofer type speaker. In some such embodiments, a tweeter type speaker is added to the system, while in others a mid-range type speaker is added to the system. In the preferred embodiment a full range type speaker is the only speaker mounted to the first mounting surface while woofer, tweeter and midrange type speakers are all mounted to the second mounting surface. In this embodiment, it is preferred that a crossover, or other filter system, is utilized in order to limit the ranges of frequencies sent to the woofer, tweeter and midrange type speakers.

Some embodiments of the system include sound ports disposed through the first mounting surface the second mounting surface to allow a channeling of the sound created by the back wave to escape through the housing. In other embodiments, an air vent is disposed between the bottom edge of the second mounting surface and the bottom panel of the housing. This air vent is preferably substantially rectangular in shape and is sized to allow an equalization of pressure between the lower compartment of the housing and the atmosphere exterior to the housing. In the preferred embodiment, two sound ports are disposed through the top mounting surface, two sound ports are disposed through the bottom mounting surface, and an air vent is disposed between the lower compartment of the housing and the atmosphere exterior to the housing.

In operation, the speaker system is attached to an amplifier via a conventional speaker input terminal and an amplified audio signal is sent to the first and second speakers. The first and second speakers receive the audio signal and are driven to convert this signal into a first and second sound wave, which travels outward from each of the first and second speakers. Because the speakers are attached to the first and second mounting surfaces they are angled toward each other and, therefore, the first sound wave and second sound wave mix fully with one another in an area a short distance from the first and second speakers, creating a full sound.

Therefore, it is an aspect of the invention to provide a speaker system that provides a full mixing of the sound generated by the various speakers making up the system.

It is a further aspect of the invention to provide a speaker system that does not require the separate housings and cable connections of component level systems.

It is a further aspect of the invention to provide a speaker system that does not require the use of multiple wires to connect the system to an amplifier.

It is a further aspect of the invention to provide a speaker system that does not require the use of separate stands or brackets in order to aim the speakers for optimum performance.

These aspects of the invention are not meant to be exclusive and other features, aspects, and advantages of the present invention will be readily apparent to those of ordinary skill in the art when read in conjunction with the following description, appended claims and accompanying drawings.

DETAILED DESCRIPTION OF THE INVENTION

Figure 1:
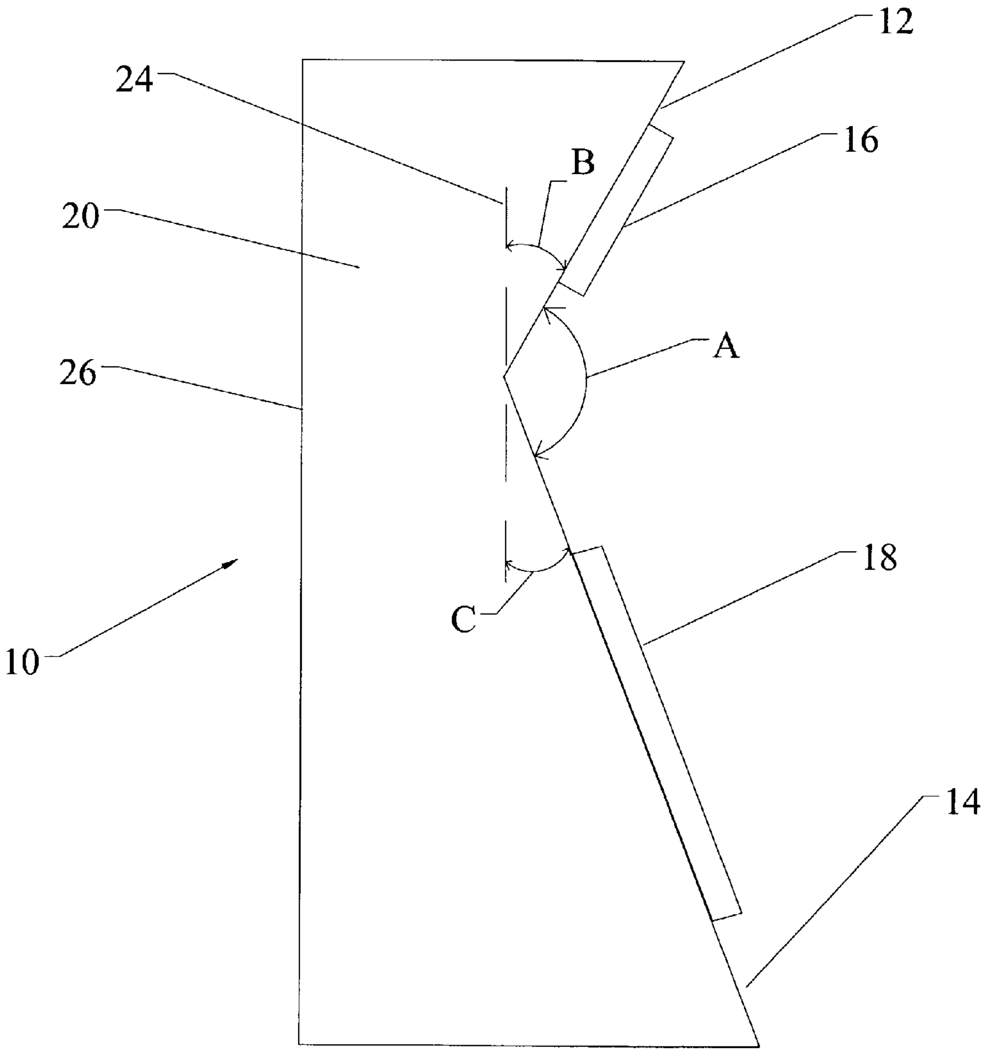
FIG. 1 is a side view of one embodiment of the speaker system of the present invention.

Referring first to FIG. 1, a side view of the basic embodiment of the speaker system 10 of the present invention is shown. The speaker system 10 of the present invention includes a first speaker 16, a second speaker 18, and a housing 20 having a first mounting surface 12 to which the first speaker 16 is mounted and a second mounting surface 14 to which the second speaker 18 is mounted. The first mounting surface 12 and the second mounting surface 14 are substantially planar and abut one another to form an included angle A of between 120 degrees and 140 degrees. Included angle A is equal to one hundred and eighty degrees minus the sum of angles B and C, which are measured from a line 24 parallel to the back wall 26 of the housing and each of the first and second mounting surfaces 12, 14. In the preferred embodiment, included angle A is 132 degrees, angle B is 27 degrees and angle C is 21 degrees.

Figure 2:
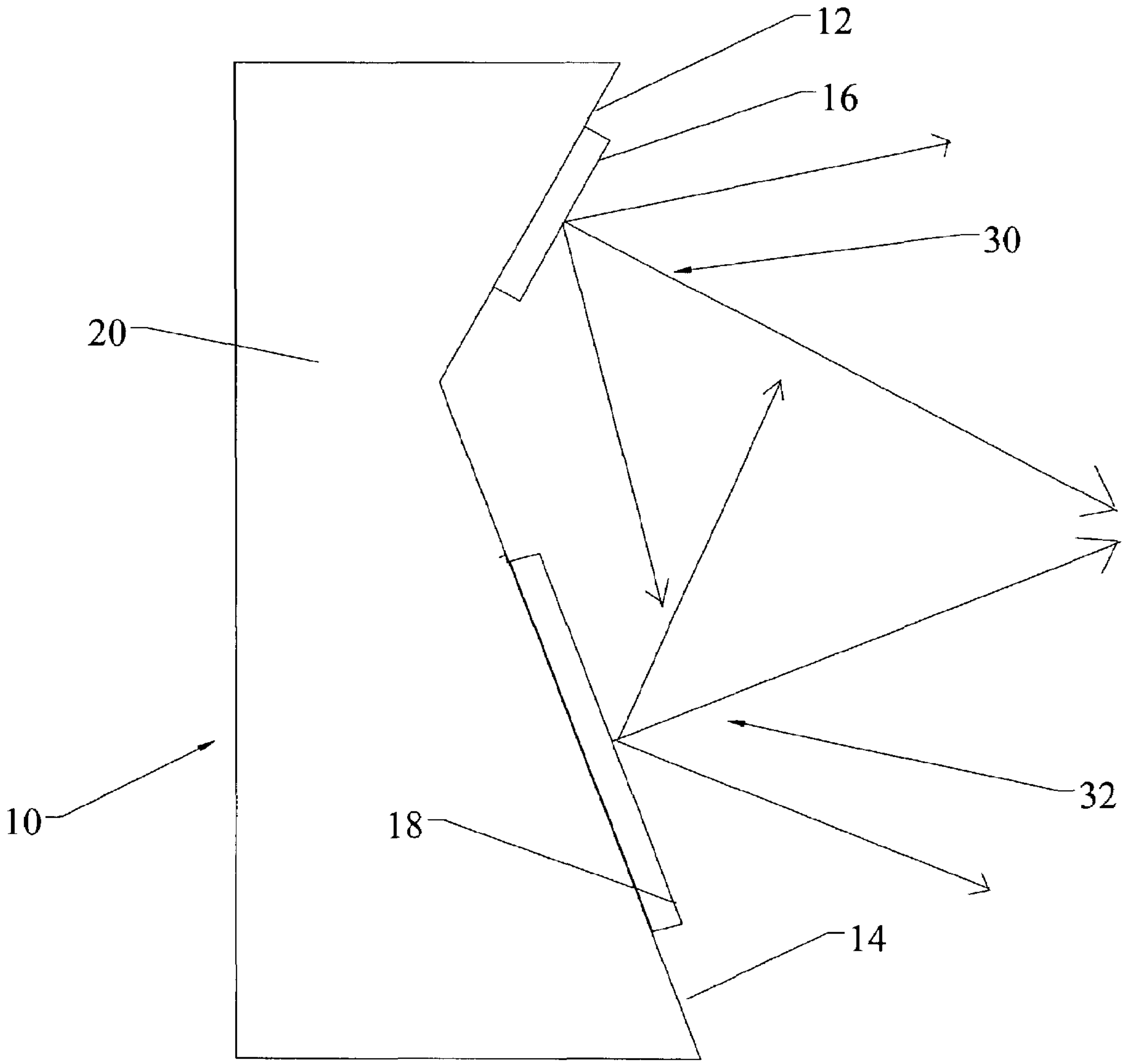
FIG. 2 is a diagrammatic side view of the embodiment of FIG. 1 showing the mixing of the first and second sound waves.

As shown in FIG. 2, because the first speaker 16 and second speaker 18 are attached to the first and second mounting surfaces 12, 14 they are angled toward each other. Accordingly, a first sound wave 30, generated by the first speaker 16 mixes with a second sound wave 32, generated by the second speaker 18, a short distance from the first and second speakers 16, 18, creating a full sound.

Figure 3:
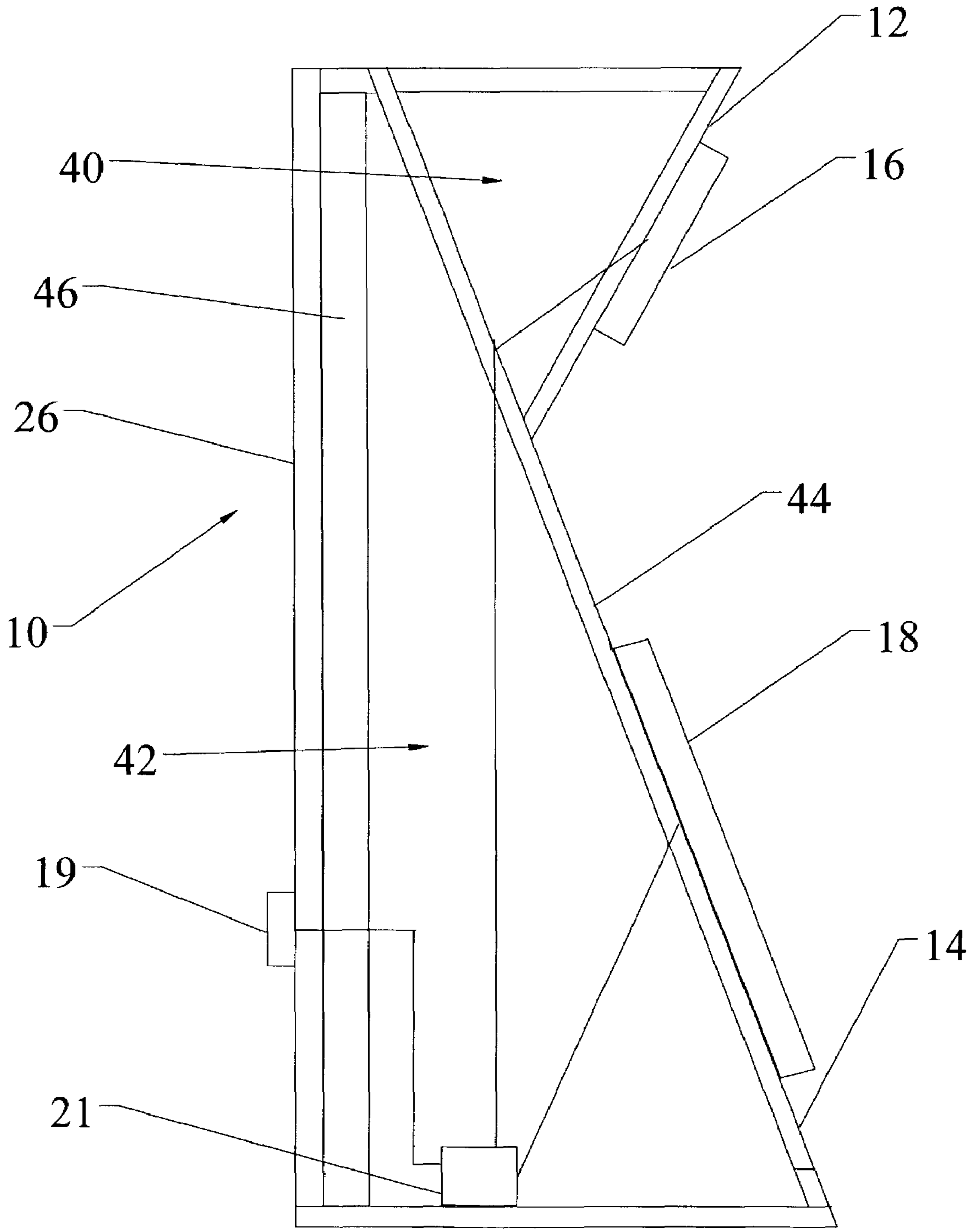
FIG. 3 is a cut away side view of the preferred housing of the present invention.

Referring now to FIG. 3, the preferred housing 20 of the speaker system 10 has a top portion 40 that includes the first mounting surface 12 and a bottom portion 42 that includes the second mounting surface 14. In this embodiment, the top portion 40 of the housing 20 is substantially sealed from the bottom portion 42 of the housing 20 to prevent the back wave created by the first speaker 16 from interfering with the back wave created by the second speaker 18. In the preferred embodiment, this is accomplished by a single panel 44, which forms both the second mounting surface 14 to which the second speaker 18 is mounted and the back wall of the top portion 40 of the housing 20. However, it is recognized that other embodiments of the invention may separate the portions 40, 42 in different manners. In still other embodiments, the top portion 40 and bottom portion 42 are allowed to communicate with one another.

The housing 20 may be made from a variety of materials, such as wood, composites, or other materials commonly utilized in the manufacture of loudspeakers, and may be manufactured in a variety of sizes. The preferred housing 20 is manufactured of a substantially rigid plastic material, which is preferred due to its relatively easy formability, its natural insulating qualities, and the ability to produce speaker systems in a variety of colors to match or accent a purchaser's décor. The prototype speaker system includes a freestanding housing that is approximately thirty-two inches high, sixteen inches wide and has a minimum depth of six and one half inches. However, it is envisioned that the housings 20 dimensioned for shelf mounting will also enjoy the benefits to the sound produced of the larger housings 50 and, therefore, the present invention should not be seen as being limited to speaker systems having housings 20 of any particular size.

Regardless of the material of manufacture and size of the housing 20, all embodiments of the housing 20 should be structurally stable and constructed so as to reduce vibration of the housing 20 that could result in distortion or other degradation of sound quality. Methods of constructing the housing 20 in such a manner are well known in the art of speaker design and manufacture and, therefore, are not elaborated upon herein.

Some embodiments of the housing 20 include an inner layer of insulation 46 affixed to one or more of their inside surfaces. This layer of insulation 46 is preferably an acoustical foam insulation that acts to absorb standing waves, sometimes referred to as a "back wave", created by the speakers 16, 18, effectively dampening these waves such that they do not have a significant effect on the sound produced by the speaker. However, in other embodiments of the system 10, the foam insulation 46 is eliminated and a plurality of baffles (not shown) is disposed within the housing 20 and also act to absorb and dampen standing waves. The use of baffle arrangements within speaker housings is a common method of dampening standing waves, and the layout of such an arrangement is well within the skill of those in the art. Accordingly, such a system is not shown or elaborated upon herein. In still other embodiments, other art recognized means for dampening standing waves are utilized.

As shown in FIG. 3, a power terminal 19 is disposed through the housing 20 and acts to supply a sound input to the speakers 16, 18. In the embodiment of FIG. 3, this terminal 19 is disposed through the back wall 26 of the housing and feeds a crossover 21 that is wired directly to the speakers 16, 18. In the preferred embodiment, this crossover is a single channel sub-woofer crossover with high pass outputs, such as those manufactured by AMS-Neve, Inc., of New York, N.Y. However, in embodiments in which speakers 16, 18 include integral filters, the crossover 21 is eliminated and the power terminal 19 is wired directly to the speakers 16, 18.

Figure 4:
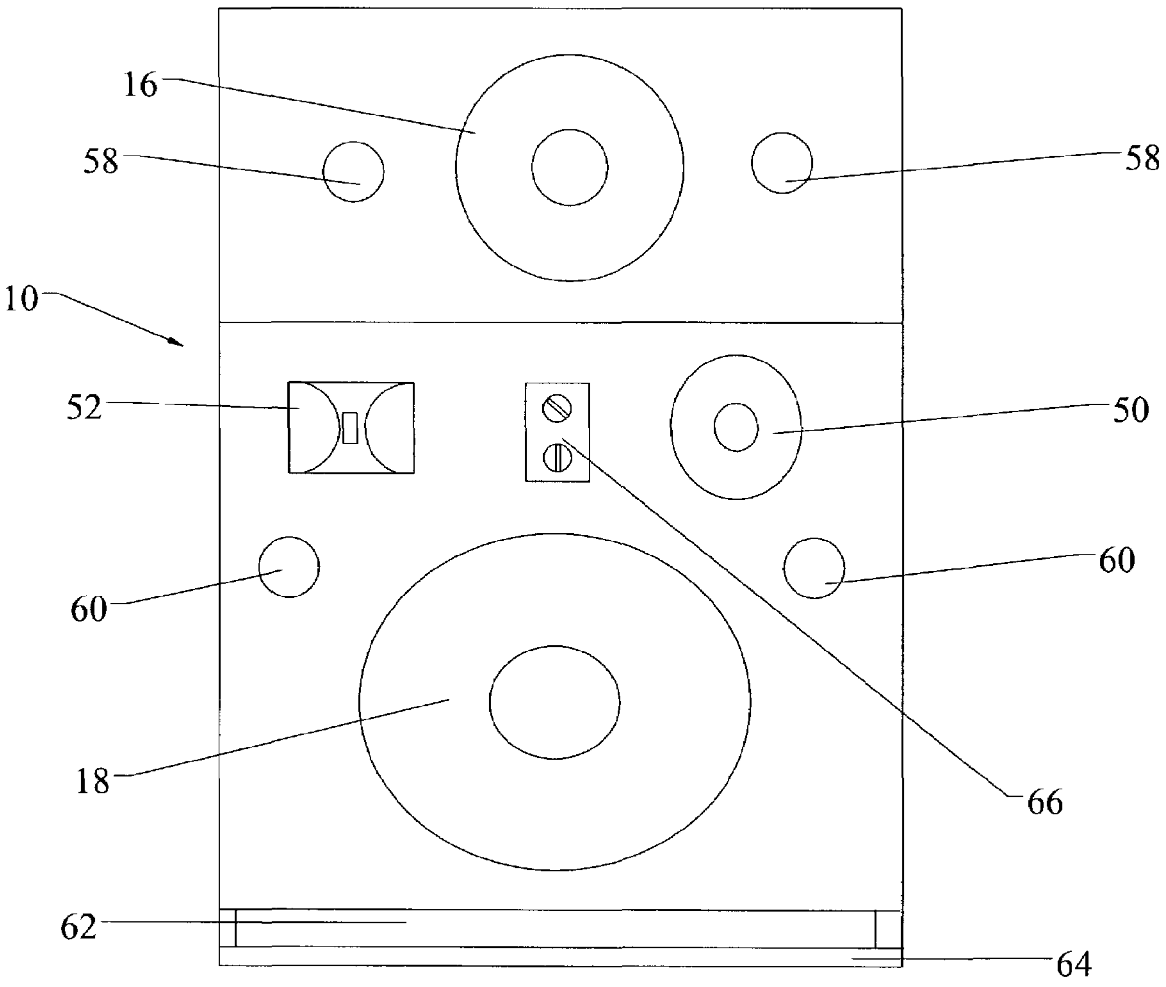
FIG. 4 is a front view of the preferred speaker system of the present invention showing the use of multiple speakers, sound ports and air vent.

Referring now to FIG. 4, the preferred speaker system 10 is shown with a plurality of speakers 16, 18, 50, 52 disposed upon mounting surfaces 12, 14. In this preferred embodiment, the first speaker 16 is a full range speaker, which promotes tight, punchy low frequencies, while also delivering a full range of sound. In the prototype speaker system 10, this full range speaker 16 is an eight-inch speaker having a one-inch voice coil 54, which operates at 100 watts at 8 ohms of resistance to produce sound in a frequency range of between 20 Hz to 3.5 kHz.

The second speaker 18 in the preferred embedment is a woofer type speaker, which produces superior low frequency sound. The woofer type speaker 18 is preferably suspended with an opening in the housing by a rubber half roll in order to allow the sound to emanate in a distortion free manner. In the prototype speaker system 10, the woofer type speaker 18 is a twelve inch speaker having a Kapton® voice coil 56 and a vented pole piece (not shown) to add dependability and to reduce the operating temperature of the voice coil. The prototype speaker has a peak operational rating of 150 watts at 8 ohms of resistance and has 30 ounce magnet, with vas cu. ft. of 4.77, and operates at frequency range of between 19 Hz and 5 kHz.

The preferred speaker system 10 also includes a midrange type speaker 50 and a tweeter type speaker 52 mounted to the second mounting surface 14 of the housing. The preferred midrange type speaker 50 is a sealed back type midrange speaker for reduced distortion and includes a ferrofluid-enhanced magnet for increased power handling. In the prototype system, the midrange speaker 50 is a five inch speaker having a one inch voice coil, fourteen ounce magnet weight, and a peak operational rating of 100 Watts at 8 ohms resistance to produce sound in the frequency range of between 500 Hz and 6 kHz. The preferred tweeter type speaker 52 is a horn type tweeter with slots rather than a voice coil, which is preferred due to its long life and enhanced dispersion over conventional tweeters. The preferred tweeter type speaker produces a frequency response in the range of between 3 kHz and 30 kHz.

The embodiment of the system 10 shown in FIG. 4 also includes sound ports 58, 60 disposed through the first mounting surface 12 and the second mounting surface 14 to allow a channeling of the sound created by the back wave to escape through the housing 20, effectively eliminating standing waves that would affect the quality of sound produced by the speakers. In the prototype system 10 these sound ports 58, 60 are sized differently, with the sound ports 58 through the first mounting surface 12 being 2.59 inches in length and having a 1.36 inch inside opening, and the sound ports 60 through the second mounting surface 14 being 1.13 inches in length and having a 1.97 inch inside opening. However, it is recognized that sound ports 58, 60 of different sizes and/or different numbers of sound ports may also be utilized.

The embodiment of FIG. 4 also includes an air vent 62, which is disposed between the bottom edge 64 of the second mounting surface 14 and the bottom panel 66 of the housing 20. This air vent 62 is preferably substantially rectangular in shape and is sized to allow an equalization of pressure between the lower portion of the housing 20 and the atmosphere exterior to the housing 20. In the prototype system 10, the air vent is one and one half inches high and extends the entire width of the bottom of the housing 20. However, it is recognized that air vents 62 having different dimensions may be substituted to achieve similar results.

As shown in FIG. 4, the preferred system 10 also includes a dual volume control 66 for controlling the volume of the midrange and tweeter type speakers 50, 52. However, in other embodiments, this volume control 66 may be eliminated and volume may be controlled via a separate equalizer or volume control associated with the component that supplies the signal to the speaker system 10.

Figure 5:
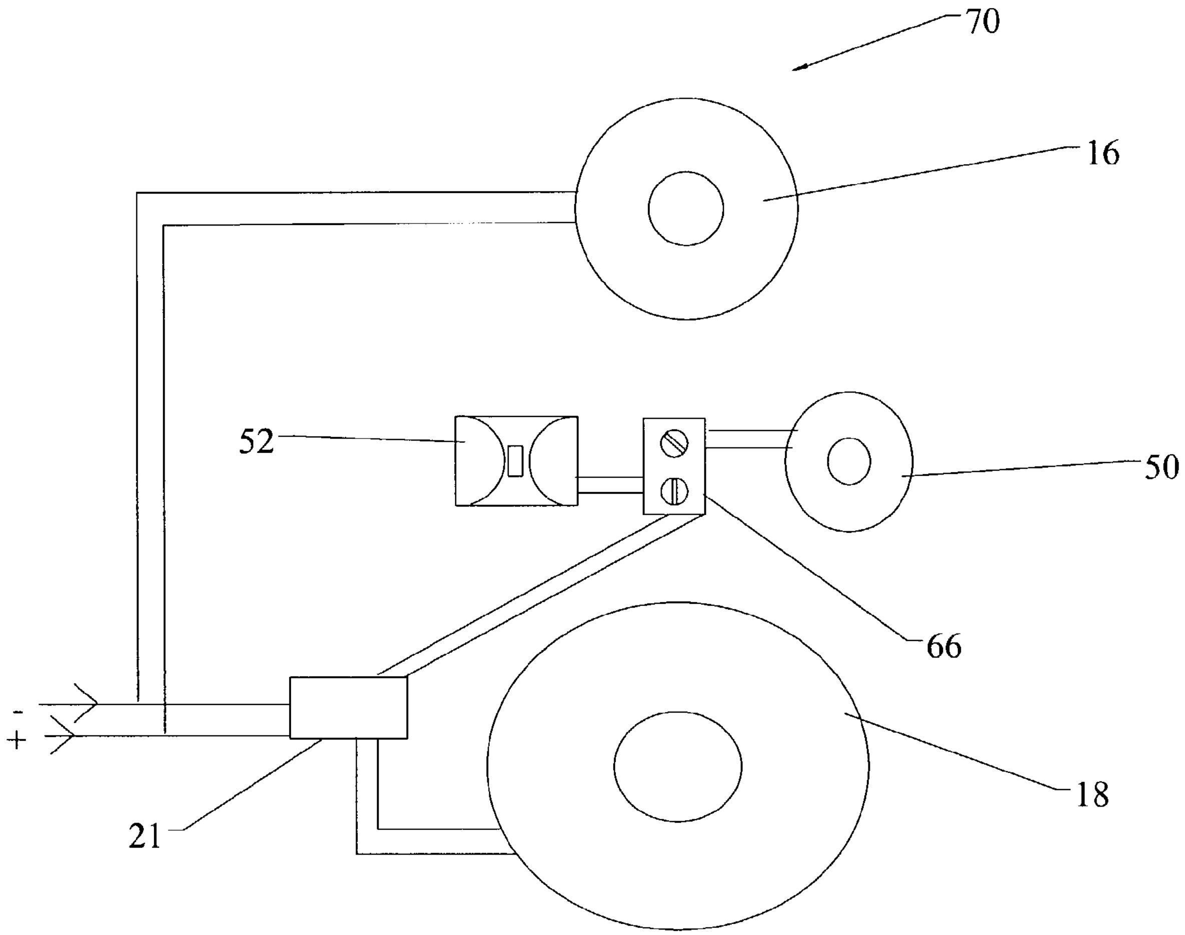
FIG. 5 is a wiring diagram of the preferred electrical wiring system of the speaker system of the present invention.

Referring now to FIG. 5, a wiring diagram of the preferred wiring system 70 is shown. The preferred wiring system 70 includes a crossover 21, a volume control 66 and the four speakers 16, 18, 50, 52 described with reference to FIG. 4. The crossover 70 is used to filter the frequencies of sound send to the woofer 18, midrange 50, and tweeter 52 type speakers. Were the crossover 70, or some other type of filter, not utilized, each of the speakers 16, 18, 50 and 52 would perform as full range speakers, effectively eliminating the benefits of using multiple types of speakers. The preferred crossover 70 passes only frequencies below 150 Hz to the woofer 18, frequencies of between 500 Hz and 6 kHz to the midrange 50, and frequencies of between 3 kHz and 30 kHz to the tweeter 52. However, in other embodiments that utilize speakers 18, 50 and 52 that have different frequency ranges, the crossover 70 is selected to coincide with these ranges.

As shown in FIG. 5, the full range speaker 16 is not wired through the crossover 70, but rather is hooked directly to the input. The woofer 18 is wired directly to the low pass output of the crossover 70, while the tweeter 50 and midrange 52 are wired from the high pass output of the crossover 70 through the volume control 66. However, it is recognized that in other embodiments, in which volume controls are not utilized, the high pass output of the crossover may be connected directly to the tweeter 50 and midrange 52 speakers.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

What is claimed is:

1. A speaker system comprising:

a first speaker of a first type;

a second speaker of a second type;

a third speaker of a third type;

a housing comprising a top portion that comprises a first mounting surface to which said first speaker is mounted and a bottom panel portion that comprises a second mounting surface to which said second speaker and said third speaker is mounted;

said housing further comprising at least two sound ports, wherein a first of said at least two sound ports is disposed through said first mounting surface and wherein a second of said at least two sound ports is disposed through said second mounting surface;

wherein said first speaker is a full range type speaker, wherein said second speaker is a woofer type speaker and wherein said third speaker is a tweeter type speaker;

wherein said first mounting surface and said second mounting surface are substantially planar;

wherein said first mounting surface abuts said second mounting surface; and wherein a plane formed by said first mounting surface and a plane formed by said second mounting surface from an included angle of between 120 degrees and 140 degrees.

2. The speaker system as claimed in claim 1 wherein said included angle is between 125 degrees and 135 degrees.

3. The speaker system as claimed in claim 2 wherein said included angle is between 130 degrees and 135 degrees.

4. The speaker system as claimed in claim 1 further comprising at least one midrange type speaker.

5. The speaker system as claimed in claim 4 wherein said at least one midrange type speaker is mounted to said second mounting surface.

6. The speaker system as claimed in claim 1 further comprising at least one air vent.

7. The speaker system as claimed in claim 1 further comprising means for dampening sound waves within said housing.

8. The speaker system as claimed in claim 7 wherein said means for dampening sound waves comprises at least one layer of acoustical foam insulation disposed within said housing.

9. The speaker system as claimed in claim 1 further comprising filtering means for filtering a frequency of sound provided to at least one of said first speaker and said second speaker.

10. The speaker system as claimed in claim 9 wherein said filtering means comprises a crossover.

11. A speaker system comprising:

at least three speakers;

a housing having a width and a height and comprising a top portion that comprises a first mounting surface to which a first of said at least three speakers is mounted and a bottom portion that comprises a bottom panel and a second mounting surface to which a second of said at least three speakers and a third of said at least three speakers are mounted, and a bottom;

wherein said first mounting surface and said second mounting surface are substantially planar;

wherein said first mounting surface abuts said second mounting surface;

wherein a plane formed by said first mounting surface and a plane formed by said second mounting surface from an included angle of between 120 degrees and 140 degrees;

and wherein said housing further comprising an air vent disposed between said second mounting surface and said bottom panel, wherein said air vent is substantially rectangular in shape and extends across said width of said housing and is sized to allow an equalization of pressure between said lower portion of said housing and an atmosphere exterior to said housing.

12. The speaker system as claimed in claim 11 wherein said included angle is between 125 degrees and 135 degrees.

13. The speaker system as claimed in claim 11 wherein one of said at least three speakers is a full range type speaker, one of said at least three speakers is a woofer type speaker and one of said at least three speakers is a tweeter type speaker.

14. The speaker system as claimed in claim 13 further comprising a midrange type speaker, wherein said full range speaker is mounted to said first mounting surface and said mid-range type speaker, said woofer type speaker and said tweeter type speaker are mounted to said second mounting surface.

15. The speaker system as claimed in claim 11 further comprising at least two sound ports, wherein a first of said at least two sound ports is disposed through said first mounting surface and wherein a second of said at least two sound ports is disposed through said second mounting surface.

16. The speaker system as claimed in claim 11 further comprising means for dampening sound waves within said housing.

17. The speaker system as claimed in claim 16, wherein said means for dampening sound waves comprises at least one layer of acoustical foam insulation disposed within said housing.

18. The speaker system as claimed in claim 11 further comprising filtering means for filtering a frequency of sound provided to at least one of said first speaker and said second speaker.

* * * * *